(12) United States Patent
Takebayashi

(10) Patent No.: US 10,388,560 B2
(45) Date of Patent: Aug. 20, 2019

(54) SHAFT-END MOUNTING STRUCTURE

(71) Applicant: NGK Insulators, Ltd., Nagoya, Aichi (JP)

(72) Inventor: Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 305 days.

(21) Appl. No.: 15/444,919

(22) Filed: Feb. 28, 2017

(65) Prior Publication Data

US 2017/0170052 A1  Jun. 15, 2017

Related U.S. Application Data

(63) Continuation of application No. PCT/JP2016/050796, filed on Jan. 13, 2016.

(Continued)

(51) Int. Cl.

| *H05B 3/68* | (2006.01) |
|---|---|
| *A21B 2/00* | (2006.01) |
| *H01L 21/687* | (2006.01) |
| *H01L 21/67* | (2006.01) |
| *H01L 21/683* | (2006.01) |

(52) U.S. Cl.
CPC .. *H01L 21/68792* (2013.01); *H01L 21/67103* (2013.01); *H01L 21/67126* (2013.01); *H01L 21/6831* (2013.01); *H01L 21/68757* (2013.01)

(58) Field of Classification Search
CPC ......... H01L 21/67103; H01L 21/67126; H01L 21/6831; H01L 21/68757; H01L 21/68792
USPC .............. 219/443.1–468.2; 392/416–418; 118/723 R, 723 VE, 724–730

See application file for complete search history.

(56) References Cited

U.S. PATENT DOCUMENTS 6,376,808 B2 *  4/2002  Tachikawa ........ H01L 21/67103
                                                      118/725
2001/0054385 A1 *  12/2001  Horiguchi ........... C23C 16/4581
                                                      118/723 R (Continued)

FOREIGN PATENT DOCUMENTS

| JP | 2002-009079 A | 1/2002 |
|---|---|---|
| JP | 2003-272805 A | 9/2003 |
| JP | 2005-317749 A | 11/2005 |

OTHER PUBLICATIONS

International Search Report and Written Opinion (Application No. PCT/JP2016/050796) dated Apr. 19, 2016.

(Continued)

*Primary Examiner* — Sang Y Paik
(74) *Attorney, Agent, or Firm* — Burr & Brown, PLLC

(57) ABSTRACT

A shaft-end mounting structure according to the present invention is a structure to mount an end of a hollow ceramic shaft 20 in a gastight manner on a circumference of a through hole 104 in a base plate 102 of a chamber 100, the shaft 20 being integrated with a ceramic plate 12 on which a wafer is to be placed. A ring member 26 is connected in a gastight manner to an end face of the shaft 20 with a metal layer 28 provided therebetween, the member 26 being composed of a metal material or a metal-ceramic composite material. Bolts 32 extend through the base plate 102 and a metal seal 30 and fasten the member 26 so as to draw the member 26 toward the base plate 102 while the member 26 is placed on the circumference of the through hole 104 with the seal 30 provided therebetween.

5 Claims, 3 Drawing Sheets

Related U.S. Application Data

(60) Provisional application No. 62/105,367, filed on Jan. 20, 2015.

(56) References Cited

U.S. PATENT DOCUMENTS

| | | | |
|---|---|---|---|
| 2003/0173349 A1 | 9/2003 | Unno et al. | |
| 2005/0253285 A1 | 11/2005 | Kuibira et al. | |
| 2006/0186109 A1* | 8/2006 | Goto | H01L 21/67103 219/444.1 |
| 2009/0123140 A1* | 5/2009 | Komatsu | C23C 16/4586 392/418 |

OTHER PUBLICATIONS

English translation of International Preliminary Report on Patentability (Application No. PCT/JP2016/050796) dated Aug. 3, 2017.

* cited by examiner

SHAFT-END MOUNTING STRUCTURE

BACKGROUND OF THE INVENTION

1. Field of the Invention

The present invention relates to a shaft-end mounting structure.

2. Description of the Related Art

A member for an apparatus for producing a semiconductor, the member including a ceramic plate on which a wafer is to be placed and a hollow ceramic shaft, is known (for example, Patent Literature 1).

CITATION LIST

Patent Literature

PTL 1: Japanese Unexamined Patent Application Publication No. 2003-272805

SUMMARY OF THE INVENTION

A shaft-end mounting structure is known in which an end of a hollow ceramic shaft of such a member for an apparatus for producing a semiconductor is mounted in a gastight manner on the circumference of a through hole in a base plate of a chamber as illustrated in FIG. 4. In the mounting structure, a flange 110 of a hollow ceramic shaft 108 is placed on the circumference of a through hole 104 in a base plate 102 of a chamber 100 with a ring-like metal seal 106 provided therebetween. The hollow ceramic shaft 108 is integrated with a ceramic plate 112 into a ceramic heater 114. A ring-shaped clamp 116 formed by combining two half rings having an inverted L-shape in cross section together presses against the flange 110 of the hollow ceramic shaft 108 from above. Bolts 118 extend through the clamp 116 from an upper surface of the clamp 116 and screwed into the base plate 102 of the chamber 100. This results in a state in which an internal space S1 of the chamber 100 is separated from an internal space S2 of the hollow ceramic shaft 108 in a gastight manner. Thus, when the internal space S1 of the chamber 100 is evacuated, it is possible to isolate the internal space S1 from the internal space S2 of the hollow ceramic shaft 108.

However, the flange 110 of the hollow ceramic shaft 108 is sandwiched between the clamp 116 and the base plate 102 of the chamber 100 in the mounting structure illustrated in FIG. 4. Thus, overtightening the bolts 118 can break the hollow ceramic shaft 108. To avoid breaking the hollow ceramic shaft 108, the bolts 118 can be insufficiently tightened to cause the metal seal 106 to function improperly, thereby disadvantageously failing to isolate the internal space S1 of the chamber 100 from the internal space S2 of the hollow ceramic shaft 108 in a gastight manner.

The present invention has been accomplished in light of the foregoing problems and mainly aims to sufficiently isolate an internal space of a chamber from an internal space of a hollow ceramic shaft in a gastight manner without breaking a hollow ceramic shaft.

A shaft-end mounting structure of the present invention is a shaft-end mounting structure to mount an end of a hollow ceramic shaft in a gastight manner on a circumference of a through hole in a base plate of a chamber, the hollow ceramic shaft being integrated with a ceramic plate on which a wafer is to be placed, the shaft-end mounting structure comprises:

a ring member connected in a gastight manner to an end face of the hollow ceramic shaft with a metal layer provided therebetween, the ring member being composed of a metal material or a metal-ceramic composite material; and a fastening member that extends through the base plate and a seal layer and that fastens the ring member so as to draw the ring member toward the base plate while the ring member is placed on the circumference of the through hole in the base plate of the chamber with the seal layer provided therebetween.

In the shaft-end mounting structure, the hollow ceramic shaft is joined in a gastight manner to the chamber with the ring member and the metal layer provided therebetween. The ring member is placed on the circumference of the through hole in the base plate of the chamber with the seal layer provided therebetween. The fastening member extends through the base plate and the seal layer and fastens the ring member to the base plate so as to draw the ring member toward the base plate. The ring member is composed of a metal material or a metal-ceramic composite material and has higher strength than a ceramic. Thus, although strongly tightening the fastening member draws the ring member toward an upper surface of the base plate of the chamber with the seal layer provided therebetween, there is no risk of breaking the ring member, and the hollow ceramic shaft is not tightened. Therefore, even if the fastening member is strongly tightened, there is no risk of breaking the hollow ceramic shaft. Moreover, since the fastening member is strongly tightened, the metal seal provides sufficiently good sealing properties, thereby sufficiently isolating the internal space of the chamber from the internal space of the hollow ceramic shaft in a gastight manner.

In the shaft-end mounting structure of the present invention, the fastening member may be a bolt that extends through the base plate and the seal layer from a lower surface of the base plate and that is screwed into a bolt hole in the ring member.

In the shaft-end mounting structure of the present invention, preferably, the hollow ceramic shaft is composed of AlN, and the ring member is composed of Mo, N, or an FeNiCo-based alloy (for example, Kovar (registered trademark) or the like). In this case, the thermal expansion coefficient of the ring member is close to the thermal expansion coefficient of the ceramic. It is thus possible to prevent the breakage of the joint of the ring member and the hollow ceramic shaft caused by a difference in thermal expansion if heating and cooling are repeated.

In the shaft-end mounting structure of the present invention, the metal layer is preferably formed of an Al layer or an Al alloy layer (for example, an Al—Si—Mg-based alloy layer or Al—Mg-based alloy layer). In this case, thermal compression bonding (TCB) can be employed. Thus, a pinhole is less likely to be formed in the metal layer, thereby improving the sealing properties of the metal layer.

DETAILED DESCRIPTION OF THE INVENTION

Figure 1:
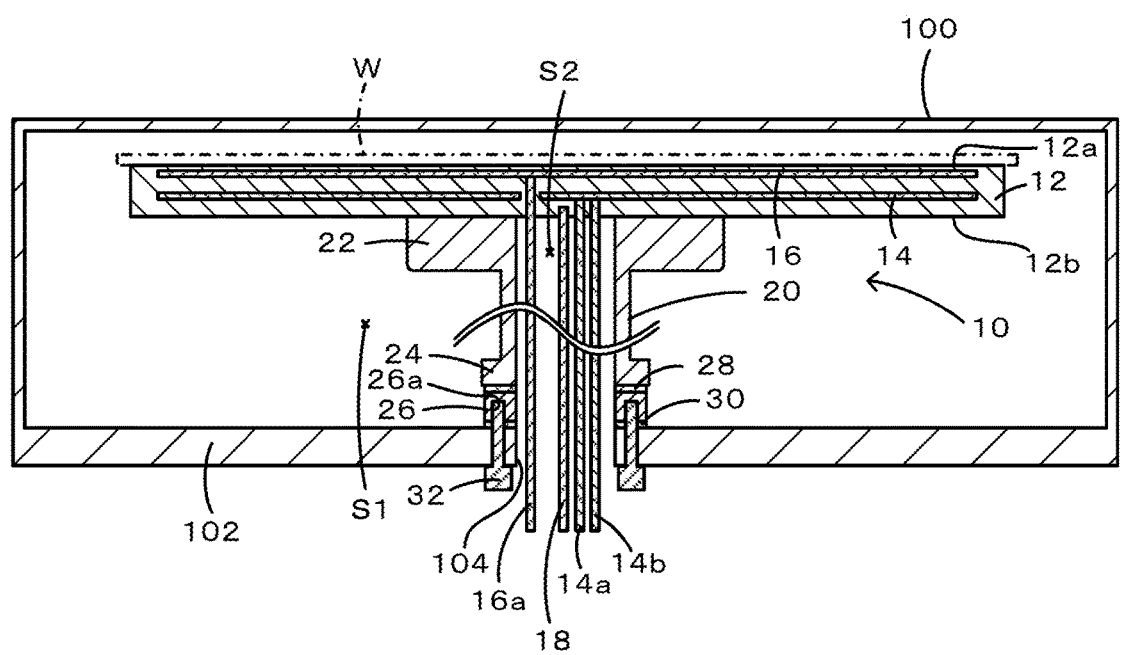
FIG. 1 is a cross-sectional view of a shaft-end mounting structure according to an embodiment of the present invention.

A shaft-end mounting structure according to an embodiment of the present invention will be described below with reference to FIG. 1. FIG. 1 is a cross-sectional view of a shaft-end mounting structure according to an embodiment of the present invention, and specifically, is a cross-sectional view of a ceramic heater 10 attached in the chamber 100.

The ceramic heater 10 is used to heat a wafer W and attached to the inside of the chamber 100 for a semiconductor process. The ceramic heater 10 includes a ceramic plate 12 including a wafer-supporting surface 12a that can support the wafer W; and a hollow ceramic shaft 20 connected to a surface (back surface) 12b of the ceramic plate 12 opposite the wafer-supporting surface 12a.

The ceramic plate 12 is a disk-like member composed of AlN as a main component. A heater electrode 14 and an RF electrode 16 are embedded in the ceramic plate 12. The heater electrode 14 is formed of a coil composed of Mo as a main component and arranged throughout the entire area of the ceramic plate 12 to form a pattern similar to a unicursal line. One end of the heater electrode 14 is connected to a heater terminal rod 14a serving as a positive electrode, and the other end is connected to a heater terminal rod 14b serving as a negative electrode. The RF electrode 16 is a disk-like thin-layer electrode with a diameter slightly smaller than the ceramic plate 12 and formed of a mesh sheet in which thin metal wires composed of Mo as a main component are knitted so as to form a net. The RF electrode 16 is embedded in a portion of the ceramic plate 12 between the heater electrode 14 and the wafer-supporting surface 12a. An RF terminal rod 16a is connected to the substantially middle of the RF electrode 16.

A hollow ceramic shaft 20 is a cylindrical member composed of AlN and includes a first flange 22 around an upper opening and a second flange 24 around a lower opening. An end face of the first flange 22 is joined to the back surface 12b of the ceramic plate 12 by TCB. An end face of the second flange 24 is joined to a ring member 26 composed of Mo by TCB. The term "TCB" indicates a method in which a joining metal material is sandwiched between two target members to be joined and the two members are subjected to pressure bonding while being heated to a solidus temperature or lower of the joining metal material. Examples of the joining metal material include joining materials composed of Al alloys containing Al and Mg, such as Al—Si—Mg-based joining materials and Al—Mg-based joining materials. For example, in the case where a joining material containing 88.5% by mass Al, 10% by mass Si, and 1.5% by mass Mg and having a solidus temperature of about 560° C. and a liquidus temperature of about 590° C. is used as an Al—Si-Mg-based joining material, TCB is performed by applying a pressure of 20 to 140 kg/mm² and preferably 30 to 60 kg/mm² for 3 to 6 hours under heating at the solidus temperature or lower (for example, about 520° C. to 550° C.). A metal layer 28 originating from the joining metal material used in TCB is formed between the end face of the second flange 24 and the ring member 26. The metal layer 28 is formed by TCB; hence, a pinhole is less likely to be formed, resulting in good hermeticity. A similar metal layer (not illustrated) is formed between an end face of the first flange 22 and the ceramic plate 12. A metal seal 30 (seal layer) is arranged between the ring member 26 and the circumference of the through hole 104 in the base plate 102 of the chamber 100. Bolts 32 (fastening member) extend through the base plate 102 and the metal seal 30 from the lower surface of the base plate 102 and are screwed into bolt holes 26a in the underside of the ring member 26. The number of the bolts 32 used is three or more and preferably six or more, and the bolts 32 are equally spaced in the circumferential direction of the ring member 26. When the bolts 32 are installed from the lower surface of the base plate 102, washers may be used. The heater terminal rods 14a and 14b, the RF terminal rod 16a, and a sheathed thermocouple 18 to measure the temperature of the ceramic plate 12 are arranged in the internal space S2 of the hollow ceramic shaft 20.

An example of use of the ceramic heater 10 according to the embodiment will be described below. The wafer W is placed on the wafer-supporting surface 12a of the ceramic heater 10. The internal space S1 of the chamber 100 is filled with a predetermined atmosphere (for example, a hydrogen atmosphere, an argon atmosphere, or vacuum). At this time, the internal space S1 is isolated from the internal space S2 of the hollow ceramic shaft 20. The wafer W is subjected to a process such that the ring member 26 is not damaged from the atmosphere in the chamber (for example, wafer annealing). If necessary, a plasma generated between parallel plate electrodes by applying a high AC voltage to the RF electrode 16 through the RF terminal rod 16a may be used, the parallel plate electrodes including a horizontal counter electrode (not illustrated) arranged at an upper portion in the chamber 100 and the RF electrode 16 embedded in the ceramic heater 10. When the wafer W is processed, a high DC voltage may be applied to the RE electrode 16 to generate an electrostatic force, whereby the wafer W may be attracted to the wafer-supporting surface 12a. The temperature of the wafer W is determined on the basis of a signal detected by the sheathed thermocouple 18, and the magnitude and on-off switching of a voltage applied between the two heater terminal rods 14a and 14b are controlled in such a manner that the temperature is a set temperature.

In the foregoing shaft-end mounting structure according to the embodiment, the hollow ceramic shaft 20 is joined in a gastight manner to the ring member 26 with the metal layer 28 provided therebetween. The ring member 26 is placed on the circumference of the through hole 104 in the base plate 102 of the chamber 100 with the metal seal 30 provided therebetween. The bolts 32 extend through the base plate 102 and the metal seal 30 from the lower surface of the base plate 102 and screwed into the ring member 26. The ring member 26 is composed of Mo, i.e., a metal material, and thus has higher strength than a ceramic. Thus, although strongly tightening the bolts 32 draws the ring member 26 toward an upper surface of the base plate 102 of the chamber 100 with the metal seal 30 provided therebetween, there is no risk of breaking the ring member 26, and the hollow ceramic shaft 20 is not tightened. Therefore, if the bolts 32 are strongly tightened, there is no risk of breaking the hollow ceramic shaft 20. Moreover, since the bolts 32 is strongly tightened, the metal seal 30 provides sufficiently good sealing properties, thereby sufficiently isolating the internal space S1 of the chamber 100 from the internal space S2 of the hollow ceramic shaft 20 in a gastight manner.

The ring member 26 is composed of Mo and has a thermal expansion coefficient close to the thermal expansion coefficient of AlN. It is thus possible to prevent the breakage of the joint of the ring member 26 and the hollow ceramic shaft 20 caused by a difference in thermal expansion if heating and cooling are repeated. Table 1 lists thermal expansion coefficients of representative ceramics and metals.

TABLE 1

| | Material | Thermal expansion coefficient (ppm/K) |
|---|---|---|
| Ceramic | AlN | 5.3 |
| | $Al_2O_3$ | 6.6 |
| | $Y_2O_3$ | 7.2 |
| | SiC | 3.7 |
| Metal | Ti | 10.4 |
| | Mo | 5.3 |
| | W | 4.5 |
| | CuW (11% Cu—89% W) | 6.5 |
| | FeNiCo-based alloy (Kovar (registered trademark)) | 5.1 |
| | Ni | 14.3 |
| | Cu | 18.9 |

(*) Measured at 300° C.

The metal layer 28 is formed of an aluminum alloy layer. Thus, TCB may be employed as described above. Therefore, a pinhole is less likely to be formed in the metal layer 28, thereby improving the sealing properties of the metal layer 28.

The present invention is not limited to the above-described embodiment, and can be carried out by various modes as long as they belong to the technical scope of the invention.

For example, although Mo is used as a material for the ring member 26 in the foregoing embodiments, W or an FeNiCo-based alloy (for example, Kovar (registered trademark)) may be used. The thermal expansion coefficients of these metals are within ±20% of the thermal expansion coefficient of the AlN ceramic used in the embodiments, as listed in Table 1. It is thus possible to prevent the breakage of the joint of the ring member 26 and the hollow ceramic shaft 20 caused by a difference in thermal expansion if heating and cooling are repeated.

Although AlN is used as a material for the ceramic plate 12 and the hollow ceramic shaft 20 in the foregoing embodiments, another ceramic may be used. For example, in the case where $Al_2O_3$ is used, CuW (11% Cu-89% W, see Table 1), which has a thermal expansion coefficient close to $Al_2O_3$, is preferably used as a material for the ring member 26.

Although the metal seal 30 is used as a seal layer in the foregoing embodiments, an O ring may be used in place of the metal seal 30. In this case, as the O ring, an O ring that withstands the operating temperature of the ceramic heater 10 is used.

Although the metal layer 28 is formed by TCB in the foregoing embodiments, the formation may be performed by brazing. Regarding a brazing material, any of various known brazing materials may be used. However, TCB is more preferable than brazing because a pinhole is less likely to be formed in the metal layer 28 formed by TCB.

Figure 2:
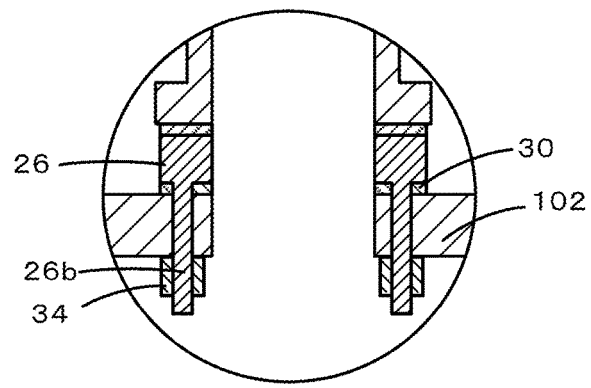
FIG. 2 is a cross-sectional view of a shaft-end mounting structure according to another embodiment of the present invention.

Although the bolts 32 are used as the fastening member in the foregoing embodiments, a structure illustrated in FIG. 2 may be used in place of the bolts 32. Specifically, fastening may be performed as follows: Bolt shanks 26b are provided in the underside of the ring member 26 in such a manner that the bolt shanks 26b extend through the metal seal 30 and the base plate 102 and protrude from the lower surface of the base plate 102. Nuts 34 are attached to the bolt shanks 26b so as to draw the ring member 26 toward the base plate 102. In this case, the same effects as in the foregoing embodiments are also provided. When the nuts 34 are attached to the bolt shanks 26b, washers may be used.

EXAMPLES

Figure 3:
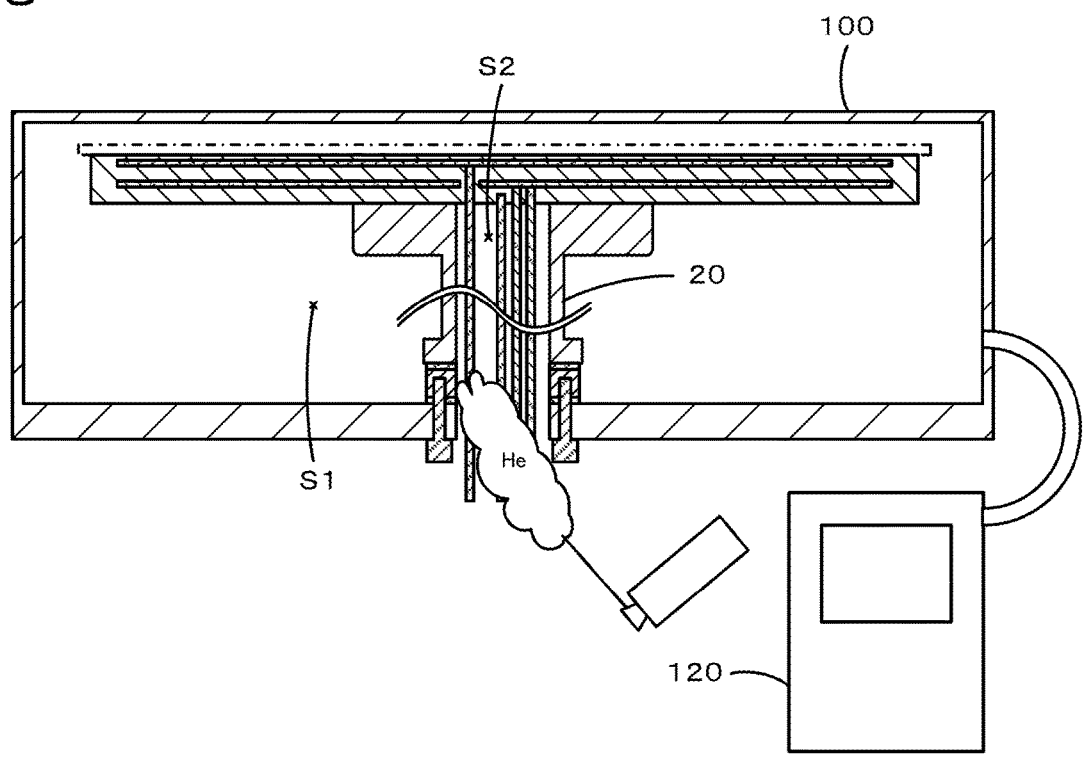
FIG. 3 is an explanatory drawing of a method for measuring the leakage rate of He leaking from a shaft end.
Figure 4:
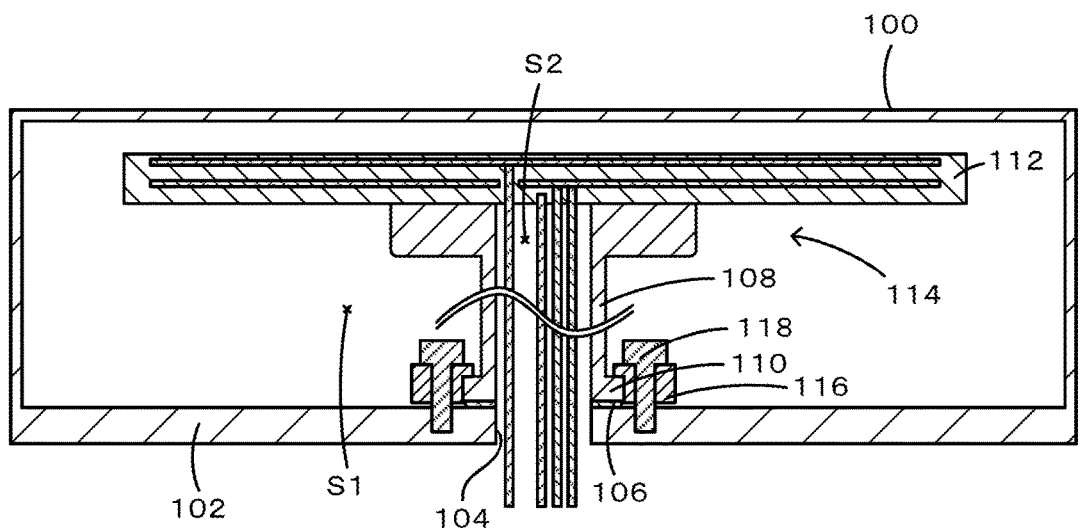
FIG. 4 is a cross-sectional view of a conventional shaft-end mounting structure.

A He leakage rate from a shaft end was evaluated in the case of using the shaft-end mounting structure in the foregoing embodiment (FIG. 1) and the case of using the conventional shaft-end mounting structure illustrated in FIG. 4. Specifically, as illustrated in FIG. 3, a He leak detector 120 is attached to a port of the chamber 100. The degree of vacuum in the chamber was set to 5E-2 [Pa], and the temperature of the shaft end was set to room temperature (RT). In this state, He gas was blown against the internal space S2 of the hollow ceramic shaft 20, the reading of the He leak detector 120 was taken, and the reading was defined as a He leakage rate at RT. Furthermore, the temperature of the shaft end was set to 100° C. Similarly, the reading of the He leak detector 120 was taken, and the reading was defined as a He leakage rate at 100° C. Regarding the conventional shaft-end mounting structure, He leakage rates were measured similarly. Table 2 summarizes the results. As listed in Table 2, when the shaft-end mounting structure illustrated in FIG. 1 was used, the He leakage rates at both RT and 100° C. were reduced to 1/10 or less of those in the conventional shaft-end mounting structure illustrated in FIG. 4.

TABLE 2

| | He leakage rate [Pa · m³/s] | |
|---|---|---|
| | RT | 100° C. |
| Conventional structure (FIG. 4) | 4.3E−08 | 6.1E−08 |
| Structure of the embodiment (FIG. 1) | 3.8E−09 | 3.5E−09 |

The present application claims priority from U.S. provisional Patent Application No. 62/105,367 filed on Jan. 20, 2015, the entire contents of which are incorporated herein by reference.

It goes without saying that the foregoing example is not limited to the present invention.

What is claimed is:

1. A shaft-end mounting structure to mount an end of a hollow ceramic shaft in a gastight manner on a circumference of a through hole in a base plate of a chamber, the hollow ceramic shaft being integrated with a ceramic plate on which a wafer is to be placed, the shaft-end mounting structure comprising:
a ring member connected in a gastight manner to an end face of the hollow ceramic shaft with a metal layer provided therebetween, the ring member being composed of a metal material or a metal-ceramic composite material; and
a fastening member that extends through the base plate and a seal layer and that fastens the ring member so as to draw the ring member toward the base plate while the ring member is placed on the circumference of the through hole in the base plate of the chamber with the seal layer provided therebetween.

2. The shaft-end mounting structure according to claim 1, wherein the fastening member is a bolt that extends through the base plate and the seal layer from a lower surface of the base plate and that is screwed into a bolt hole in the ring member.

3. The shaft-end mounting structure according to claim 1, wherein the hollow ceramic shaft is composed of AlN, and
the ring member is composed of Mo, W, or an FeNiCo-based alloy.

4. The shaft-end mounting structure according to claim 1, wherein the metal layer is formed of an Al layer or an Al alloy layer.

5. The shaft-end mounting structure according to claim 4, wherein the metal layer is formed by thermal compression bonding.

* * * * *